(12) United States Patent
Lee

(10) Patent No.: US 11,437,078 B2
(45) Date of Patent: Sep. 6, 2022

(54) VOLTAGE GENERATION CIRCUIT, SEMICONDUCTOR APPARATUS INCLUDING THE SAME, AND VOLTAGE OFFSET CALIBRATION SYSTEM

(71) Applicant: SK hynix Inc., Icheon-si (KR)

(72) Inventor: Myung Hwan Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 68 days.

(21) Appl. No.: 17/166,578

(22) Filed: Feb. 3, 2021

(65) Prior Publication Data

US 2022/0093139 A1 Mar. 24, 2022

(30) Foreign Application Priority Data

Sep. 22, 2020 (KR) ........................ 10-2020-0121954

(51) Int. Cl.
| | | |
|---|---|---|
| *G11C 5/14* | (2006.01) | |
| *H03K 5/01* | (2006.01) | |
| *H03K 19/20* | (2006.01) | |
| *H03K 5/24* | (2006.01) | |
| *H03F 3/45* | (2006.01) | |

(52) U.S. Cl.
CPC ......... *G11C 5/147* (2013.01); *H03F 3/45475* (2013.01); *H03K 5/01* (2013.01); *H03K 5/24* (2013.01); *H03K 19/20* (2013.01)

(58) Field of Classification Search
CPC ........... G11C 5/147; G11C 5/143; G11C 7/10; H03F 3/45475; H03K 5/01; H03K 5/24; H03K 19/20
USPC ........................................................ 365/226
See application file for complete search history.

(56) References Cited

U.S. PATENT DOCUMENTS

| | | | | |
|---|---|---|---|---|
| 6,191,499 B1* | 2/2001 | Severson | ................... | G06F 1/26 307/31 |
| 7,208,923 B2* | 4/2007 | Horimoto | ................. | G05F 1/56 323/269 |
| 7,737,669 B2* | 6/2010 | Jain | ..................... | H02M 3/1584 323/272 |
| 8,786,357 B1* | 7/2014 | Wright | .................... | G06F 13/24 323/283 |
| 9,760,451 B2* | 9/2017 | Totten | ........................ | G06F 1/28 |
| 9,964,986 B2* | 5/2018 | Rueger | .................... | G05F 3/262 |
| 10,185,338 B1* | 1/2019 | Lahiri | ................... | H02M 3/1584 |
| 10,451,445 B2* | 10/2019 | Nisino | .................. | G01D 5/2497 |
| 11,112,813 B2* | 9/2021 | Wei | ........................ | G05F 1/575 |

(Continued)

FOREIGN PATENT DOCUMENTS

KR 1020140080310 A 6/2014

*Primary Examiner* — Ryan Jager
(74) *Attorney, Agent, or Firm* — William Park & Associates Ltd.

(57) ABSTRACT

A voltage generation circuit includes a plurality of rectification circuits configured to be selectively activated depending on a plurality of first control signals, and to generate an internal voltage according to respective reference voltages capable of being independently trimmed depending on a plurality of second control signals; a detection circuit configured to generate a detection signal by comparing a pre-detection signal, generated in each of the plurality of rectification circuits, and a reference signal; and a storage circuit configured to store a pre-select signal provided from an external system, and to output a stored signal to each of the plurality of rectification circuits as the plurality of second control signals.

24 Claims, 6 Drawing Sheets

(56) References Cited

U.S. PATENT DOCUMENTS

| | | | | |
|---|---|---|---|---|
| 2012/0105047 A1* | 5/2012 | Huang | ................... | G05F 1/575 |
| | | | | 323/351 |
| 2014/0184184 A1* | 7/2014 | Yajima | ............... | G01R 19/0084 |
| | | | | 323/274 |
| 2022/0093139 A1* | 3/2022 | Lee | ........................ | H03K 19/20 |

* cited by examiner

VOLTAGE GENERATION CIRCUIT, SEMICONDUCTOR APPARATUS INCLUDING THE SAME, AND VOLTAGE OFFSET CALIBRATION SYSTEM

CROSS-REFERENCES TO RELATED APPLICATION

The present application claims priority under 35 U.S.C. § 119(a) to Korean application number 10-2020-0121954, filed on Sep. 22, 2020, in the Korean Intellectual Property Office, which is incorporated herein by reference in its entirety.

BACKGROUND

1. Technical Field

Various embodiments generally relate to a semiconductor circuit, and particularly, to a voltage generation circuit, a semiconductor apparatus including the same, and a voltage offset calibration system.

2. Related Art

A semiconductor apparatus includes a plurality of rectification circuits for generating an internal voltage by trimming a voltage level of power provided from outside the semiconductor apparatus, that is, external power, to be used inside the semiconductor apparatus.

The internal voltage may be used in a memory core, a peripheral circuit, an input/output circuit for signal processing, and so forth.

The plurality of rectification circuits may be disposed in a distributed manner in consideration of locations of loads in which the corresponding internal voltage is used, that is, the memory core, the peripheral circuit, the input/output circuit for signal processing, and so forth.

In the case where there is an offset, that is, a voltage level offset, between the rectification circuits which generate the same internal voltage, some of the rectification circuits may not operate in a typical fashion, and accordingly, may not maintain an internal voltage level at a target level, which may degrade the operation performance of an entire system.

SUMMARY

Various embodiments are directed to a voltage generation circuit capable of detecting and compensating for a voltage offset of rectification circuits, a semiconductor apparatus including the same, and a voltage offset calibration system.

In an embodiment, a voltage generation circuit may include: a plurality of rectification circuits configured to be selectively activated depending on a plurality of first control signals, and to generate an internal voltage according to respective reference voltages capable of being independently trimmed depending on a plurality of second control signals; a detection circuit configured to generate a detection signal by comparing a pre-detection signal, which is generated in each of the plurality of rectification circuits, and a reference signal; and a storage circuit which is configured to store a pre-select signal provided from an external system, and to output a stored signal to each of the plurality of rectification circuits as the plurality of second control signals.

In an embodiment, a semiconductor apparatus may include: a plurality of rectification circuits configured to be selectively activated depending on a plurality of first control signals, and to generate an internal voltage according to respective reference voltages capable of being independently trimmed depending on a plurality of second control signals; a detection circuit configured to generate a detection signal by comparing a pre-detection signal, which is generated in each of the plurality of rectification circuits, and a reference signal; and a state machine configured to selectively activate the plurality of first control signals and trim values of the plurality of second control signals, and store values of the plurality of second control signals at times when output offset calibration of the plurality of rectification circuits is completed, by monitoring the resultant detection signal.

In an embodiment, a voltage offset calibration system may include: a semiconductor apparatus configured to output, to an outside of the semiconductor apparatus, a detection signal which is generated by operating a plurality of rectification circuits, configured therein, depending on control signals; and an external system configured to generate the control signals, and calibrate an offset of an output voltage of each of the plurality of rectification circuits by monitoring the detection signal according to trimming a reference voltage of each of the plurality of rectification circuits by using the control signals.

DETAILED DESCRIPTION

Hereinafter, a voltage generation circuit, a semiconductor apparatus including the same, and a voltage offset calibration system will be described below with reference to the accompanying drawings through various examples of embodiments.

Figure 1:
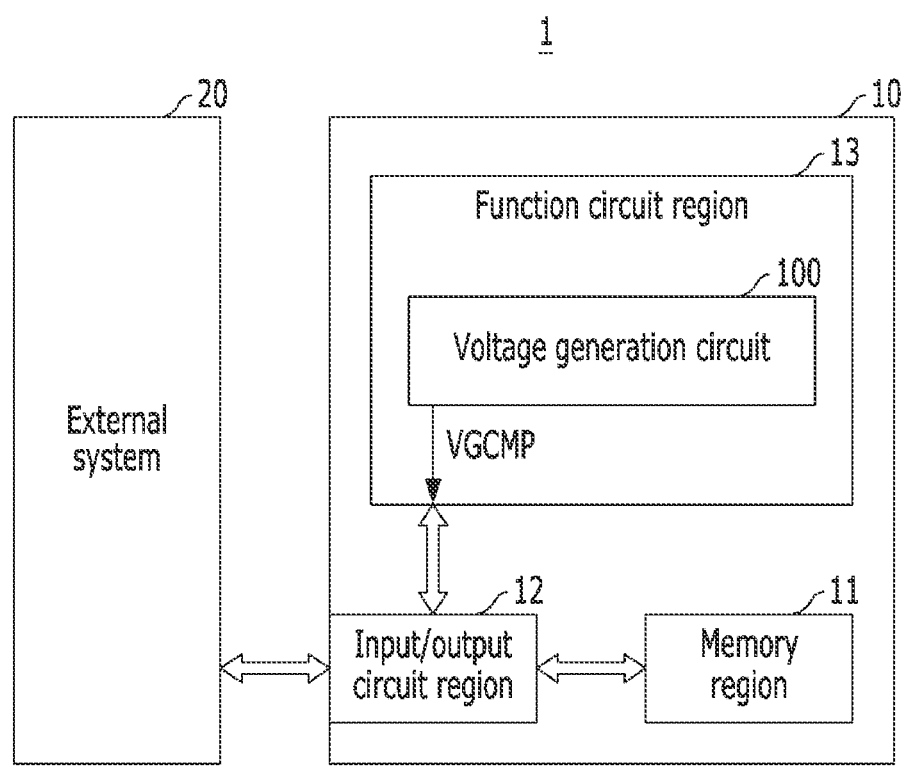
FIG. 1 is a diagram illustrating a representation of an example of a configuration of a voltage offset calibration system in accordance with an embodiment of the disclosure.

FIG. 1 is a diagram illustrating a representation of an example of the configuration of a voltage offset calibration system 1 in accordance with an embodiment of the disclosure.

Referring to FIG. 1, the voltage offset calibration system 1 in accordance with the embodiment of the disclosure may include a semiconductor apparatus 10 and an external system 20.

The semiconductor apparatus 10 may provide, to the external system 20, a detection signal VGCMP which is generated by operating rectification circuits, configured therein, depending on control signals provided from the external system 20.

The semiconductor apparatus 10 may include a memory region 11, an input/output circuit region 12 and a voltage generation circuit 100.

The voltage generation circuit 100 may be disposed in a function circuit region 13.

The function circuit region 13 may include circuits for performing various functions related with the operation of the semiconductor apparatus 10.

The voltage generation circuit 100 may generate an internal voltage by trimming a voltage level of external power to be used in the function circuit region 13, the memory region 11 and the input/output circuit region 12.

The voltage generation circuit 100 may include the rectification circuits for generating the internal voltage, and the rectification circuits may be disposed in a distributed manner in the function circuit region 13.

The voltage generation circuit 100 may generate the detection signal VGCMP by operating the rectification circuits, configured therein, depending on the control signals provided from the external system 20.

The input/output circuit region 12 may perform a data transmission/reception operation with respect to the memory region 11 and the external system 20.

The input/output circuit region 12 may include a plurality of pads, for example, data pads, command/address pads, power pads and extra pads.

The input/output circuit region 12 may provide the detection signal VGCMP to the external system 20 through at least one of the plurality of pads.

The some of the plurality of pads may be any one pad or more pads among the data pads, the command/address pads, the power pads and the extra pads.

The external system 20 may include, for example, test equipment or a memory controller.

The external system 20 may perform a voltage forcing operation, that is, an operation of applying a voltage to the semiconductor apparatus 10 and thereby making levels of the output terminals of the rectification circuits of the semiconductor apparatus 10 the same as a target level of the internal voltage.

The external system 20 may calibrate an offset of the output voltage of each of the rectification circuits by trimming the reference voltage of each of the rectification circuits of the semiconductor apparatus 10 and monitoring the resultant detection signal VGCMP provided from the semiconductor apparatus 10.

Figure 2:
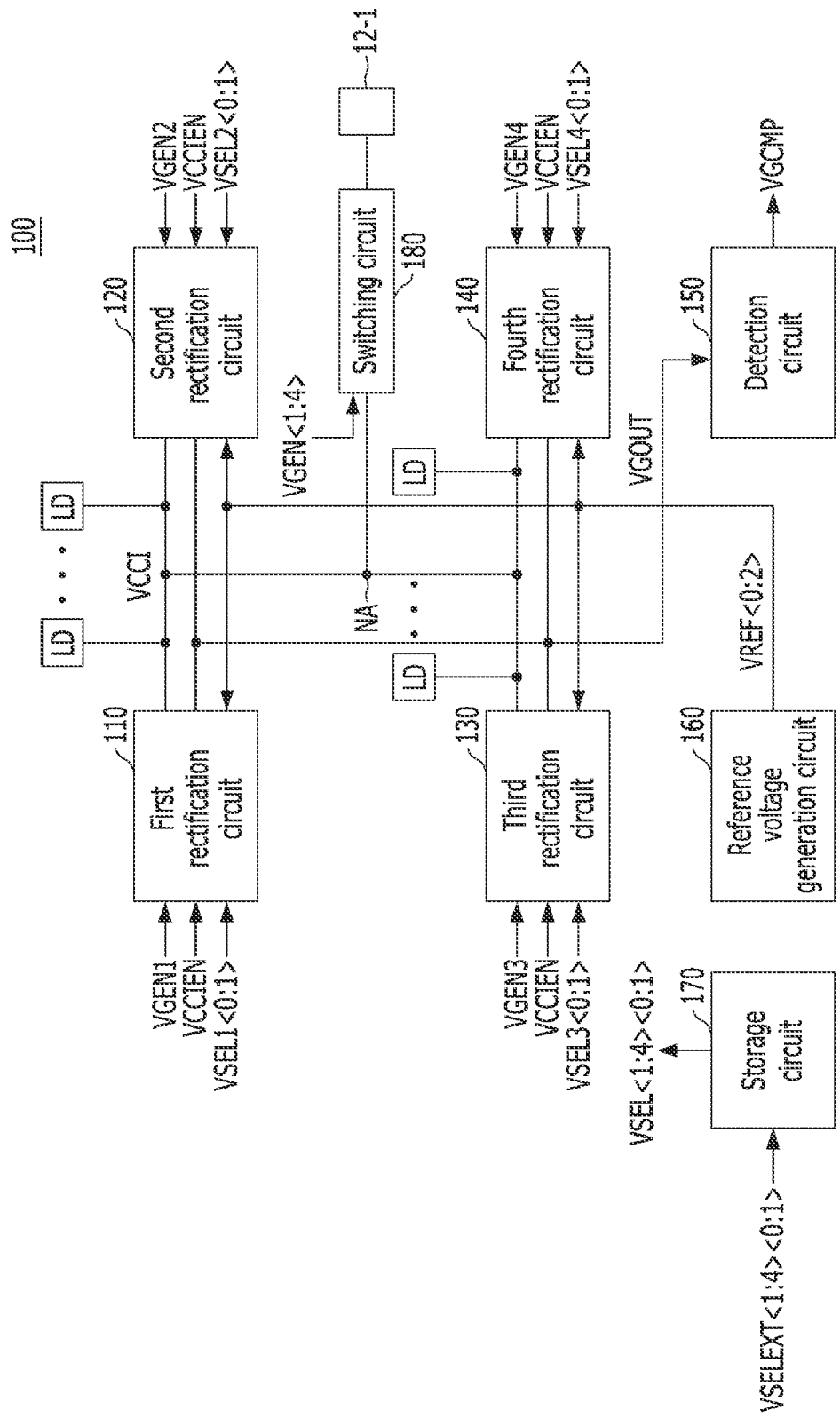
FIG. 2 is a diagram illustrating a representation of an example of a configuration of a voltage generation circuit illustrated in FIG. 1.

The external system 20 may generate the control signals for controlling the semiconductor apparatus 10 so that the detection signal VGCMP is generated, FIG. 2 is a diagram illustrating a representation of an example of the configuration of the voltage generation circuit 100 illustrated in FIG. 1.

Referring to FIG. 2, the voltage generation circuit 100 may include a plurality of rectification circuits, for example, first to fourth rectification circuits 110 to 140, a detection circuit 150, a reference voltage generation circuit 160, a storage circuit 170 and a switching circuit 180.

The first to fourth rectification circuits 110 to 140 may be configured to generate an internal voltage VCCI.

The output lines of the first to fourth rectification circuits 110 to 140 may be coupled in common, and a plurality of loads LD may be coupled to the output lines which are coupled in common.

The plurality of loads LD may be included in the function circuit region 13 which is described above with reference to FIG. 1.

The plurality of loads LD may be disposed in a distributed manner over the entire area of the function circuit region 13.

The first to fourth rectification circuits 110 to 140 may be disposed in a distributed manner in the function circuit region 13 in consideration of locations and distances of the plurality of loads LD.

The first to fourth rectification circuits 110 to 140 may be activated depending on a plurality of first control signals VGEN<1:4> and an internal voltage enable signal VCCIEN.

The plurality of first control signals VGEN<1:4> may be selectively activated in a test mode for an offset calibration operation of the semiconductor apparatus 10.

The internal voltage enable signal VCCIEN may be activated in a typical operation of the semiconductor apparatus 10, and may be deactivated in a state in which the operations of the first to fourth rectification circuits 110 to 140 are not necessary, for example, in a power-down mode.

The first to fourth rectification circuits 110 to 140 may independently trim respective reference voltages depending on a plurality of second control signals VSEL<1:4><0:1>.

The first to fourth rectification circuits 110 to 140 may each select one of a plurality of pre-reference voltages VREF<0:2> depending on the plurality of second control signals VSEL<1:4><0:1>, respectively, and may use the selected one as a reference voltage.

The first to fourth rectification circuits 110 to 140 may be activated or deactivated in common depending on the internal voltage enable signal VCCIEN.

The first to fourth rectification circuits 110 to 140 may be selectively activated or deactivated depending on the plurality of first control signals VGEN<1:4>, respectively.

The first rectification circuit 110 may be activated depending on any one of the plurality of first control signals VGEN<1:4>, for example, the first control signal VGEN<1>.

The first rectification circuit 110 may select one of the plurality of pre-reference voltages VREF<0:2> depending on any one of the plurality of second control signals VSEL<1:4><0:1>, for example, the second control signal VSEL<1><0:1>, and may use the selected one as a reference voltage.

The second rectification circuit 120 may be activated depending on another one of the plurality of first control signals VGEN<1:4>, for example, the first control signal VGEN<2>.

The second rectification circuit 120 may select one of the plurality of pre-reference voltages VREF<0:2> depending on another one of the plurality of second control signals VSEL<1:4><0:1>, for example, the second control signal VSEL<2><0:1>, and may use the selected one as a reference voltage.

The third rectification circuit 130 may be activated depending on another one of the plurality of first control signals VGEN<1:4>, for example, the first control signal VGEN<3>.

The third rectification circuit 130 may select one of the plurality of pre-reference voltages VREF<0:2> depending on another one of the plurality of second control signals VSEL<1:4><0:1>, for example, the second control signal VSEL<3<0:1>, and may use the selected one as a reference voltage.

The fourth rectification circuit 140 may be activated depending on another one of the plurality of first control signals VGEN<1:4>, for example, the first control signal VGEN<4>.

The fourth rectification circuit 140 may select one of the plurality of pre-reference voltages VREF<0:2> depending on another one of the plurality of second control signals VSEL<1:4><0:1>, for example, the second control signal VSEL<4><0:1 and may use the selected one as a reference voltage.

The first to fourth rectification circuits 110 to 140 may have the same circuit configuration.

The detection circuit 150 may generate the detection signal VGCMP according to a pre-detection signal VGOUT which is generated in each of the first to fourth rectification circuits 110 to 140.

The detection circuit 150 may generate the detection signal VGCMP by comparing the pre-detection signal VGOUT and a reference signal, that is, by comparing current of the pre-detection signal VGOUT and reference current.

The reference voltage generation circuit 160 may generate the plurality of pre-reference voltages VREF<0:2> which have different voltages.

The storage circuit 170 may store pre-select signals VSELEXT<1:4><0:1> provided from outside of the semiconductor apparatus 10, and may output stored signals as the plurality of second control signals VSEL<1:4>0:1>.

The switching circuit 180 may couple a first node NA and a pad 12-1 depending on the plurality of first control signals VGEN<1:4>.

The output lines of the first to fourth rectification circuits 110 to 140 may be coupled in common to the first node NA.

The pad 12-1 may be any one of the plurality of pads of the input/output circuit region 12 illustrated in FIG. 1.

The external system 20 may perform a voltage forcing operation, that is, an operation of applying a voltage to the pad 12-1 and thereby making levels of the output terminals of the first to fourth rectification circuits 110 to 140 the same as a target level of the internal voltage VCCI.

Figure 3:
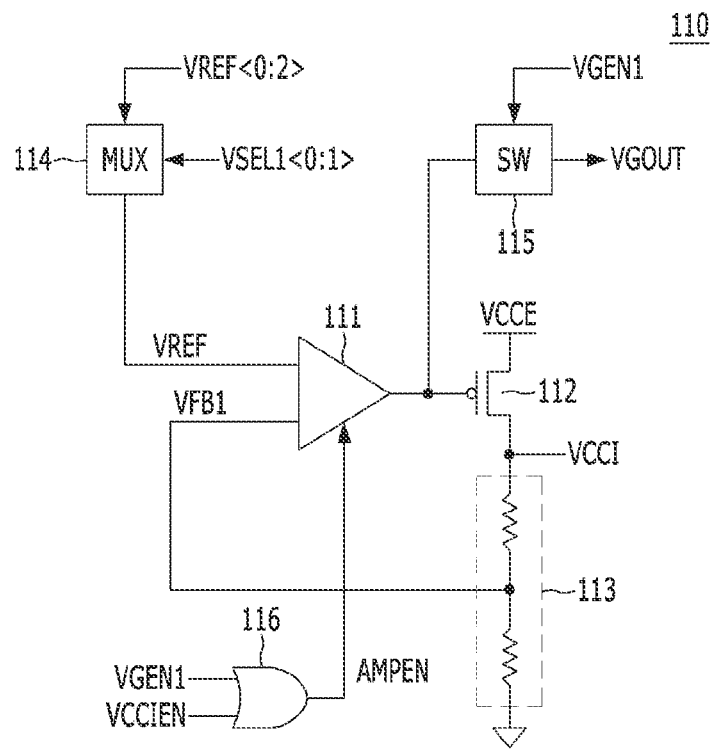
FIG. 3 is a diagram illustrating a representation of an example of a configuration of a first rectification circuit illustrated in FIG. 2.

FIG. 3 is a diagram illustrating a representation of an example of the configuration of the first rectification circuit 110 illustrated in FIG. 2.

Referring to FIG. 3, the first rectification circuit 110 may include a differential amplifier 111, a driver 112, a divider resistor 113, a multiplexer (MUX) 114, a switch 115 and a logic gate 116.

The differential amplifier 111 may output a result of comparing a reference voltage VREF and a feedback voltage VFB1.

The differential amplifier 111 may output a result of comparing the reference voltage VREF and the feedback voltage VFB1, by being activated depending on a third control signal AMPEN.

The differential amplifier 111 may be activated when the third control signal AMPEN is a high level.

The driver 112 may generate the internal voltage VCCI by driving an external voltage VCCE depending on an output of the differential amplifier 111.

The divider resistor 113 may output the feedback voltage VFB1 by dividing the internal voltage VCCI.

The multiplexer 114 may output the reference voltage VREF by selecting one of the plurality of pre-reference voltages VREF<0:2> depending on the second control signal VSEL<1><0:1>.

The switch 115 may output the output of the differential amplifier 111 as the pre-detection signal VGOUT to the outside of the first rectification circuit 110 depending on the first control signal VGEN<1>.

The logic gate 116 may output a result of ORing the first control signal VGEN<1> and the internal voltage enable signal VCCIEN, as the third control signal AMPEN.

Figure 4:
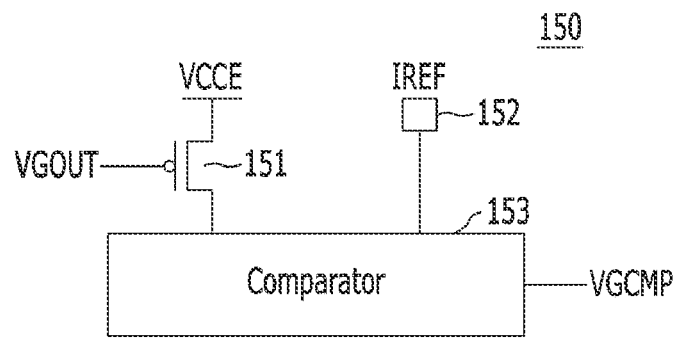
FIG. 4 is a diagram illustrating a representation of an example of a configuration of a detection circuit illustrated in FIG. 2.

FIG. 4 is a diagram illustrating a representation of an example of the configuration of the detection circuit 150 illustrated in FIG. 2.

Referring to FIG. 4, the detection circuit 150 may include a driver 151, a reference current source 152 and a comparator 153.

The driver 151 may drive current corresponding to the external voltage VCCE depending on the pre-detection signal VGOUT.

The driver 151 may include a PMOS transistor having a source terminal to which the external voltage VCCE is applied, a gate to which the pre-detection signal VGOUT is inputted and a drain terminal to which the comparator 153 is coupled.

The comparator 153 may generate the detection signal VGCMP by comparing current IREF according to the reference current source 152 and current driven by the driver 151.

The comparator 153 may output the detection signal VGCMP at a high level in the case where, for example, current driven by the driver 151 is larger than the current IREF according to the reference current source 152.

The comparator 153 may output the detection signal VGCMP at a low level in the case where, for example, current driven by the driver 151 is smaller than the current IREF according to the reference current source 152.

Figure 5:
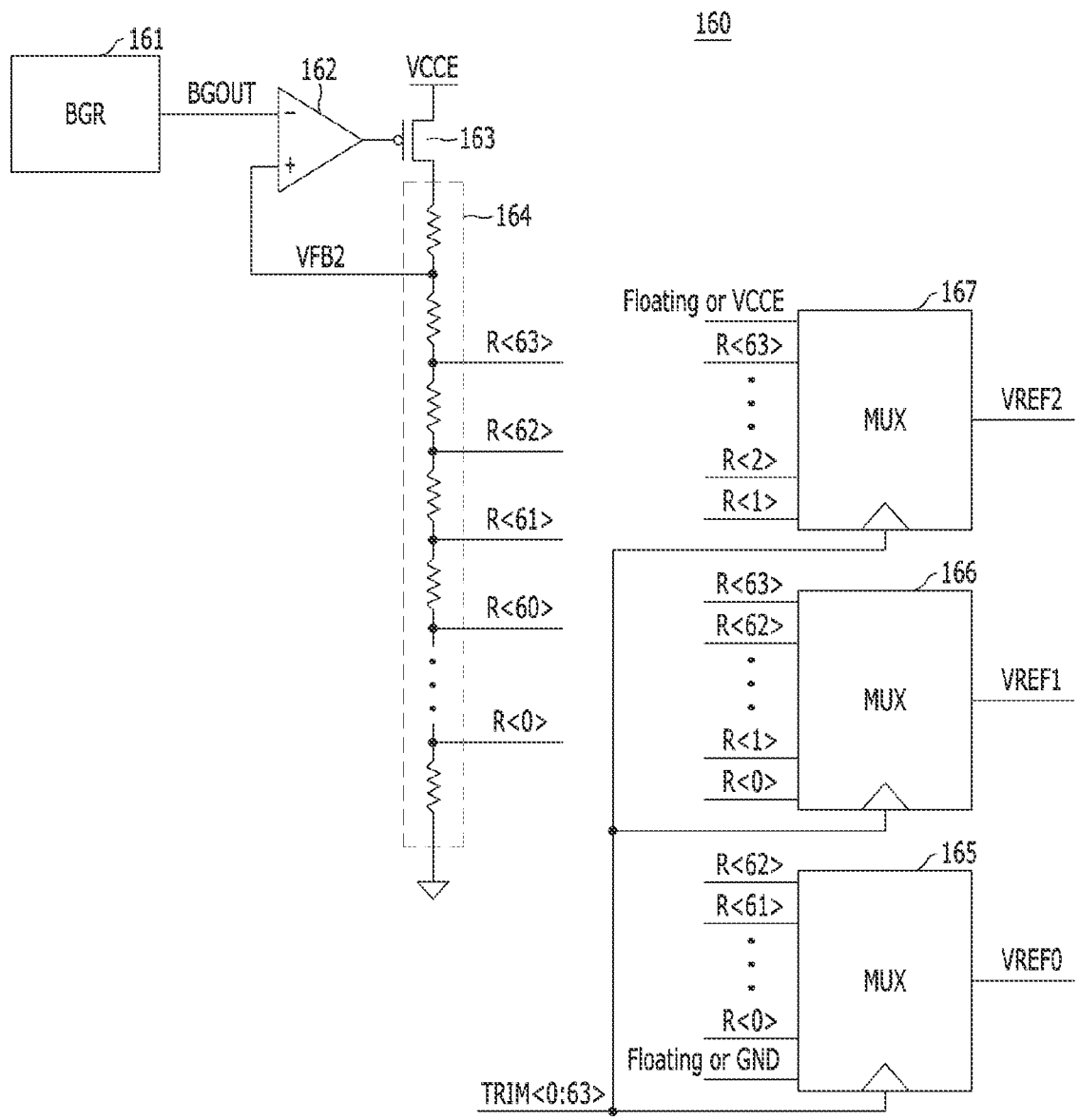
FIG. 5 is a diagram illustrating a representation of an example of a configuration of a reference voltage generation circuit illustrated in FIG. 2.

FIG. 5 is a diagram illustrating a representation of an example of the configuration of the reference voltage generation circuit 160 illustrated in FIG. 2.

Referring to FIG. 5, the reference voltage generation circuit 160 may include a band gap reference circuit 161, a differential amplifier 162, a driver 163, a divider resistor 164 and a plurality of multiplexers (MUX) 165 to 167.

The band gap reference circuit 161 may generate a band gap voltage BGOUT having a constant level regardless of a temperature variation, by using a bipolar junction transistor.

The differential amplifier 162 may output a result of comparing the band gap voltage BGOUT and a feedback voltage VFB2.

The driver 163 may drive current corresponding to the external voltage VCCE depending on an output of the differential amplifier 162.

The driver 163 may include a PMOS transistor having a source terminal to which the external voltage VCCE is applied, a gate to which the output of the differential amplifier 162 is inputted and a drain terminal to which the divider resistor 164 is coupled.

The divider resistor 164 may generate a plurality of node voltages R<0:63> by dividing a voltage depending on current driven by the driver 163.

The divider resistor 164 may include a plurality of resistors which are coupled in series between the drain terminal of the driver 163 and a ground terminal.

A voltage of a node having, for example, a division ratio of 1/2, among nodes to which the plurality of resistors are coupled may be outputted as the feedback voltage VFB2, and the plurality of node voltages R<0:63> may be outputted from the remaining nodes.

The plurality of multiplexers 165 to 167 may generate the plurality of pre-reference voltages VREF<0:2> by using a ground voltage, the plurality of node voltages R<0:63> and the external voltage VCCE depending on trim signals TRIM<0:63>.

The number of the plurality of multiplexers 165 to 167 may be changed depending on the number of required pre-reference voltages.

The embodiment of the disclosure illustrates an example in which first to third multiplexers 165 to 167 are configured to generate the plurality of pre-reference voltages VREF<0:2>.

The first multiplexer 165 may generate the pre-reference voltage VREF0 by selecting one of the ground voltages and the plurality of node voltages R<0:62> depending on the trim signals TRIM<0:63>.

The second multiplexer 166 may generate the pre-reference voltage VREF1 by selecting one of the plurality of node voltages R<0:63> depending on the trim signals TRIM<0:63>.

The third multiplexer 167 may generate the pre-reference voltage VREF2 by selecting one of the plurality of node voltages R<1:63> and the external voltage VCCE depending on the trim signals TRIM<0:63>.

Figure 6:
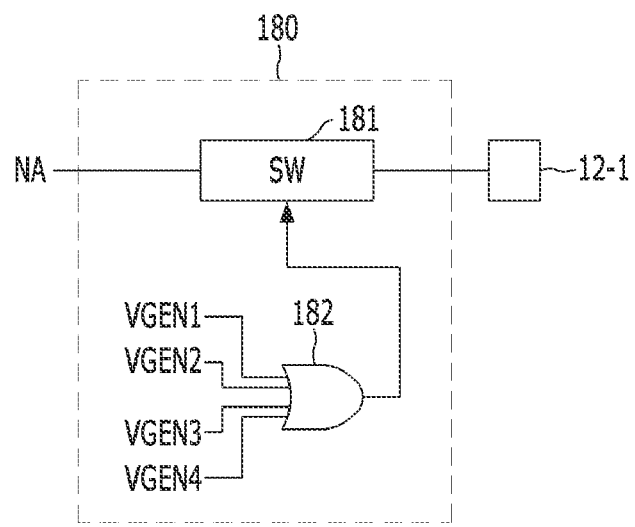
FIG. 6 is a diagram illustrating a representation of an example of a configuration of a switching circuit illustrated in FIG. 2.

FIG. 6 is a diagram illustrating a representation of an example of the configuration of the switching circuit 180 illustrated in FIG. 2.

Referring to FIG. 6, the switching circuit 180 may include a switch 181 and a logic gate 182.

The switch 181 may be coupled between the first node NA and the pad 12-1.

The logic gate 182 may turn on the switch 181 when any one of the plurality of first control signals VGEN<1:4> is a first logic level, for example, a high level.

The logic gate 182 may turn off the switch 181 when all of the plurality of first control signals VGEN<1:4> are second logic levels, that is, low levels.

That is to say, in the embodiment of the disclosure, the first node NA and the pad 12-1 may be coupled by using the switching circuit 180 only during a test period in which the output offset calibration of the first to fourth rectification circuits 110 to 140 is performed, so that the voltage forcing of the external system 20 is possible. In the embodiment of the disclosure, the first node NA and the pad 12-1 may be electrically decoupled by using the switching circuit 180 during a typical operation, so that outputs of the first to fourth rectification circuits 110 to 140 are not influenced by elements outside the semiconductor apparatus 10.

An offset calibration operation of the voltage offset calibration system 1 in accordance with the above-described embodiment of the disclosure will be described.

Referring to FIG. 2, the external system 20 may sequentially perform offset calibration operations for the first to fourth rectification circuits 110 to 140, regardless of the order of the first to fourth rectification circuits 110 to 140. In the embodiment of the disclosure, an example in which offset calibration operations are performed in the sequence of the first rectification circuit 110, the second rectification circuit 120, the third rectification circuit 130 and the fourth rectification circuit 140 will be described.

The external system 20 may actuate only the first control signal VGEN<1> among the plurality of first control signals VGEN<1:4> by using the test mode. Hereinbelow, the activation of a signal may mean that the corresponding signal is a high level.

Since the first control signal VGEN<1> is a high level, the switching circuit 180 may couple the first node NA and the pad 12-1.

The external system 20 may make a level of the output terminal of the first rectification circuit 110 the same as the target level of the internal voltage VCCI, by performing voltage forcing through the pad 12-1.

In an offset calibration process, levels of the output terminals of the first to fourth rectification circuits 110 to 140 are not generated inside the semiconductor apparatus 10, but are determined by the voltage forcing, that is, forced voltage application from outside of the semiconductor apparatus 10. Therefore, levels of the output terminals of the first to fourth rectification circuits 110 to 140 may be stably maintained to be the same as the target level of the internal voltage VCCI, regardless of the operation of the semiconductor apparatus 10.

Referring to FIG. 3, since the first control signal VGEN<1> is a high level, the third control signal AMPEN may be generated at a high level.

Since the first control signal VGEN<1> and the third control signal AMPEN are high levels, the differential amplifier 111 and the switch 115 of the first rectification circuit 110 among the first to fourth rectification circuits 110 to 140 may be activated, and accordingly, the pre-detection signal VGOUT may be provided to the detection circuit 150.

The detection circuit 150 may output the detection signal VGCMP at a high level or a low level depending on the pre-detection signal VGOUT.

Referring to FIG. 1, the detection signal VGCMP may be provided to the external system 20 through the input/output circuit region 12.

The detection signal VGCMP may be provided to the external system 20 through any one pad or a plurality of pads of the data pads, the command/address pads and the extra pads of the input/output circuit region 12.

Even under a condition where levels of the output terminals of the first to fourth rectification circuits 110 to 140 are kept constant by the voltage forcing and the reference voltage VREF is the same, the detection signal VGCMP of each of the first to fourth rectification circuits 110 to 140 may have a difference in logic level due to an offset.

During a typical operation, a rectification circuit which does not have an offset should control the driving of the driver 112 by outputting the pre-detection signal VGOUT at a low level before a level of the internal voltage VCCI rises to the target level and by outputting the pre-detection signal VGOUT at a high level in the case where a level of the internal voltage VCCI rises to be equal to or higher than the target level.

However, a rectification circuit which generates the internal voltage VCCI higher than the target level outputs the pre-detection signal VGOUT at a low level even when a level of the internal voltage VCCI rises to be equal to or higher than the target level.

A rectification circuit which generates the internal voltage VCCI lower than the target level outputs the pre-detection signal VGOUT at a high level before a level of the internal voltage VCCI reaches the target level.

A rectification circuit, for example, the first rectification circuit 110, which generates an output, that is, the internal voltage VCCI, higher than the target level in the typical operation should lower a level of the internal voltage VCCI generated by itself by lowering a level of the reference voltage VREF.

On the other hand, a rectification circuit, for example, the second rectification circuit 120, which generates an output, that is, the internal voltage VCCI, lower than the target level in the typical operation should raise a level of the internal voltage VCCI generated by itself by raising a level of the reference voltage VREF.

The external system 20 may trim a value of the pre-select signal VSELEXT<1><0:1> corresponding to the first rectification circuit 110 among the pre-select signals VSEL-EXT<1:4><0:1>, by using the test mode.

As the value of the pre-select signal VSELEXT<1><0:1> is trimmed, a value of the second control signal VSEL<1<0:1> corresponding to the first rectification circuit 110 among the plurality of second control signals VSEL<1:4><0:1> may be trimmed, and accordingly, a level of the reference voltage VREF of the first rectification circuit 110 may be trimmed.

The external system 20 may monitor the transition of a logic level of the detection signal VGCMP while trimming a level of the reference voltage VREF of the first rectification circuit 110 in the manner described above.

When a logic level of the detection signal VGCMP transitions from a high level to a low level or from a low level to a high level, the external system 20 may determine a corresponding time as a time at which the offset calibration of an output level of the first rectification circuit 110 is completed.

If a logic level transition of the detection signal VGCMP occurs, the output offset calibration for the first rectification circuit 110 may be completed by stopping the trimming of the second control signal VSEL<1><0:1> and storing a corresponding signal value.

In succession, the external system 20 may activate only the first control signal VGEN<2> among the plurality of first control signals VGEN<1:4> by using the test mode.

Since the first control signal VGEN<2> is a high level, the switching circuit 180 may couple the first node NA and the pad 12-1.

The external system 20 may make a level of the output terminal of the second rectification circuit 120 the same as the target level of the internal voltage VCCI, by performing voltage forcing through the pad 12-1.

Referring to FIG. 3, since the first control signal VGEN<2> is a high level, the third control signal AMPEN may be generated at a high level.

Since the first control signal VGEN<2> and the third control signal AMPEN are high levels, the pre-detection signal VGOUT outputted from the second rectification circuit 120 among the first to fourth rectification circuits 110 to 140 may be provided to the detection circuit 150.

The detection circuit 150 may output the detection signal VGCMP at a high level or a low level depending on the pre-detection signal VGOUT.

Referring to FIG. 1, the detection signal VGCMP may be provided to the external system 20 through the input/output circuit region 12.

The detection signal VGCMP may be provided to the external system 20 through any one pad or a plurality of pads of the data pads, the command/address pads and the extra pads of the input/output circuit region 12.

The external system 20 may trim a value of the pre-select signal VSELEXT<2><0:1> corresponding to the second rectification circuit 120 among the pre-select signals VSEL-EXT<1:4><0:1>, by using the test mode.

As a value of the pre-select signal VSELEXT<2><0:1> is trimmed, a value of the second control signal VSEL<2><0:1> corresponding to the second rectification circuit 120 among the plurality of second control signals VSEL<1:4><0:1> may be trimmed, and accordingly, a level of the reference voltage VREF of the second rectification circuit 120 may be trimmed.

The external system 20 may monitor the transition of a logic level of the detection signal VGCMP while trimming a level of the reference voltage VREF of the second rectification circuit 120.

The external system 20 may determine a time at which a logic level of the detection signal VGCMP transitions from a high level to a low level or from a low level to a high level, as a time at which the offset calibration of an output level of the second rectification circuit 120 is completed.

If a logic level transition of the detection signal VGCMP occurs, the output offset calibration for the second rectification circuit 120 is completed by stopping the trimming of the second control signal VSEL<2><0:1> and storing a corresponding signal value.

Output offset calibration for the third rectification circuit 130 and the fourth rectification circuit 140 may be performed in the same method as the above-described output offset calibration method for the first rectification circuit 110 and the second rectification circuit 120.

If the output offset calibration for the first to fourth rectification circuits 110 to 140 is completed the plurality of second control signals VSEL<1:4><0:1> for providing the reference voltage VREF capable of calibrating an output level offset of each of the first to fourth rectification circuits 110 to 140 may be stored in the storage circuit 170 of FIG. 2.

After the output offset calibration for the first to fourth rectification circuits 110 to 140 is completed, in a typical operation, all values of the plurality of first control signals VGEN<1:4> may become low levels, and accordingly, the first node NA and the pad 12-1 may be electrically decoupled such that the output of the pre-detection signal VGOUT may be blocked.

In the typical operation, when the internal voltage enable signal VCCIEN becomes a high level, the first to fourth rectification circuits 110 to 140 may generate the internal voltage VCCI at the target level according to the plurality of second control signals VSEL<1:4><0:1> stored in the storage circuit 170.

Figure 7:
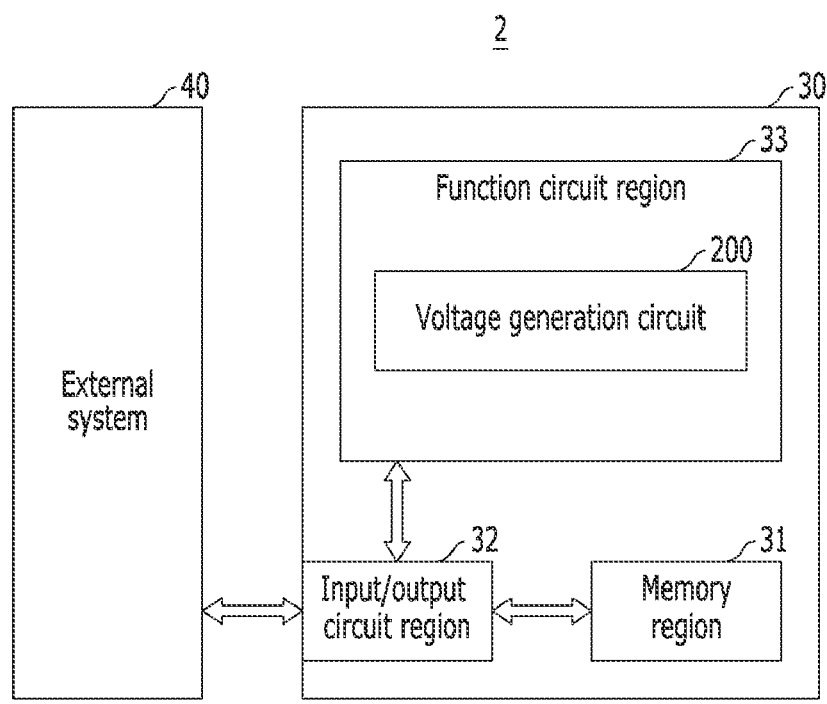
FIG. 7 is a diagram illustrating a representation of an example of a configuration of a voltage offset calibration system in accordance with another embodiment of the disclosure.

FIG. 7 is a diagram illustrating a representation of an example of the configuration of a voltage offset calibration system 2 in accordance with another embodiment of the disclosure.

Referring to FIG. 7, the voltage offset calibration system 2 in accordance with another embodiment of the disclosure may include a semiconductor apparatus 30 and an external system 40.

The semiconductor apparatus 30 may calibrate an offset of an output voltage of each of rectification circuits included therein by trimming a reference voltage of each of the rectification circuits depending on control signals generated therein and monitoring a resultant detection signal.

The semiconductor apparatus 30 may include a memory region 31, an input/output circuit region 32 and a voltage generation circuit 200.

The voltage generation circuit 200 may calibrate an offset of an output voltage of each of the rectification circuits by trimming a reference voltage of each of the rectification circuits depending on control signals and monitoring a resultant detection signal.

The voltage generation circuit 200 may be disposed in a function circuit region 33.

The function circuit region 33 may include circuits for performing various functions related with the operation of the semiconductor apparatus 30.

The voltage generation circuit 200 may generate an internal voltage by trimming a voltage level of external power to be used in the function circuit region 33, the memory region 31 and the input/output circuit region 32.

The voltage generation circuit 200 may include the rectification circuits, and the rectification circuits may be disposed in a distributed manner in the function circuit region 33.

The input/output circuit region 32 may perform a data transmission/reception operation with respect to the memory region 31 and the external system 40.

The input/output circuit region 32 may include a plurality of pads, for example, data pads, command/address pads, power pads and extra pads.

The external system 40 may perform a voltage forcing operation, that is, an operation of applying a voltage to the semiconductor apparatus 30, thereby making levels of the output terminals of the rectification circuits of the semiconductor apparatus 30 the same as a target level of the internal voltage.

The external system 40 may include, for example, test equipment, a memory controller, or a power device capable of performing voltage forcing.

Figure 8:
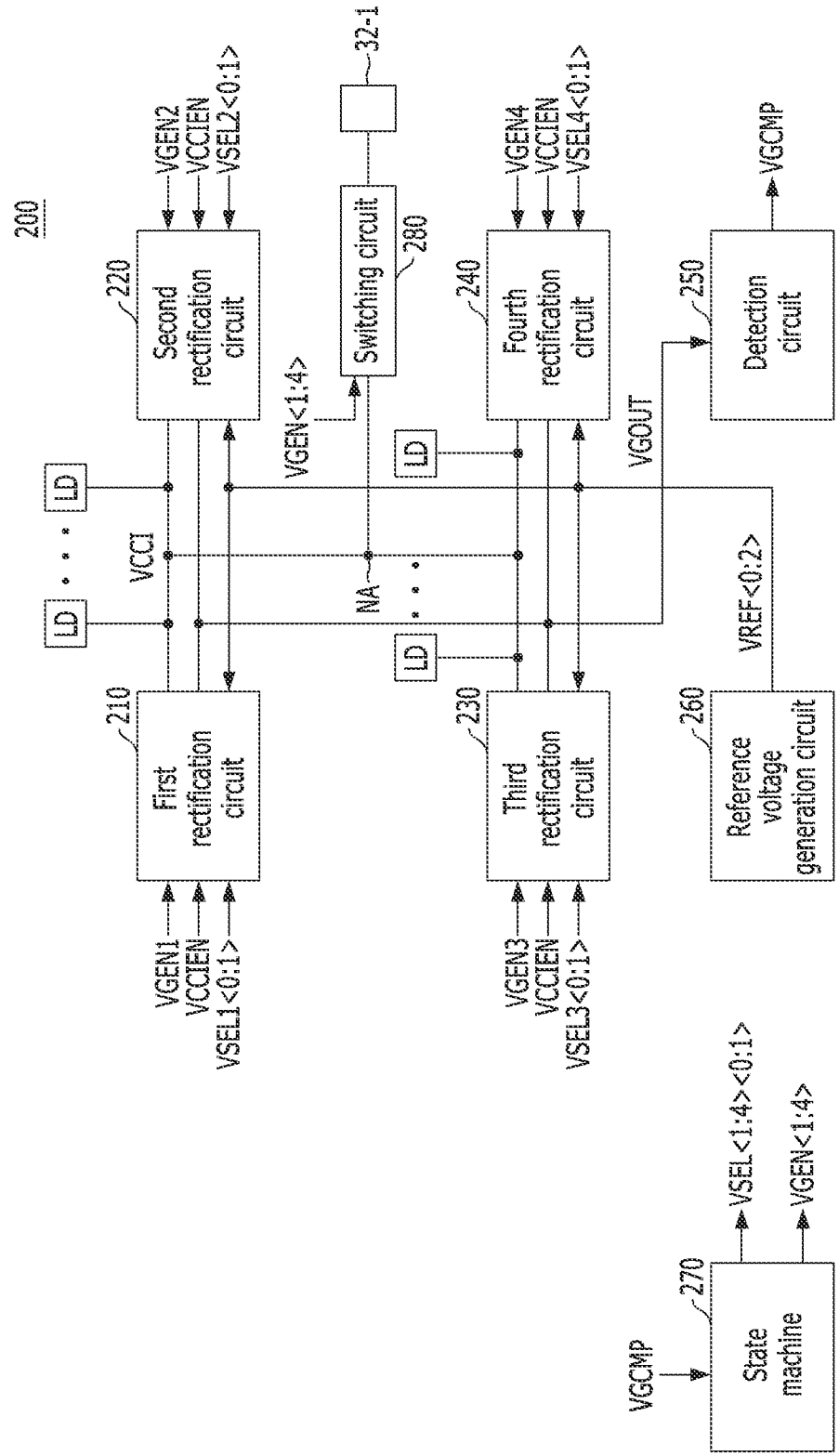
FIG. 8 is a diagram illustrating a representation of an example of a configuration of a voltage generation circuit illustrated in FIG. 7.

FIG. 8 is a diagram illustrating a representation of an example of the configuration of the voltage generation circuit 200 illustrated in FIG. 7.

Referring to FIG. 8, the voltage generation circuit 200 may include a plurality of rectification circuits, for example, first to fourth rectification circuits 210 to 240, a detection circuit 250, a reference voltage generation circuit 260, a state machine 270 and a switching circuit 280.

The first to fourth rectification circuits 210 to 240 may be configured to generate an internal voltage VCCI.

The output lines of the first to fourth rectification circuits 210 to 240 may be coupled in common, and a plurality of loads LD may be coupled to the output lines which are coupled in common.

The plurality of loads LD may be included in the function circuit region 33 of FIG. 7.

The plurality of loads LD may be disposed in a distributed manner over the entire area of the function circuit region 33.

The first to fourth rectification circuits 210 to 240 may be disposed in a distributed manner in the function circuit region 33 in consideration of locations and distances of the plurality of loads LD.

The first to fourth rectification circuits 210 to 240 may be activated depending on a plurality of first control signals VGEN<1:4> and an internal voltage enable signal VCCIEN.

The plurality of first control signals VGEN<1:4> may be internally generated in a test mode for an offset calibration operation of the semiconductor apparatus 30.

The internal voltage enable signal VCCIEN may be activated in a typical operation of the semiconductor apparatus 30, and may be deactivated in a state in which the operations of the first to fourth rectification circuits 210 to 240 are not necessary, for example, in a power-down mode.

The first to fourth rectification circuits 210 to 240 may independently trim respective reference voltages depending on a plurality of second control signals VSEL<1:4><0:1>.

The first to fourth rectification circuits 210 to 240 may each select one of a plurality of pre-reference voltages VREF<0:2> depending on the plurality of second control signals VSEL<1:4><0:1>, respectively, and may use the selected one as a reference voltage.

The first to fourth rectification circuits 210 to 240 may be activated or deactivated in common depending on the internal voltage enable signal VCCIEN.

The first to fourth rectification circuits 210 to 240 may be selectively activated or deactivated depending on the plurality of first control signals VGEN<1:4>, respectively.

The first rectification circuit 210 may be activated depending on any one of the plurality of first control signals VGEN<1:4>, for example, the first control signal VGEN<1>.

The first rectification circuit 210 may select one of the plurality of pre-reference voltages VREF<0:2> depending on any one of the plurality of second control signals VSEL<1:4><0:1>, for example, the second control signal VSEL<1><0:1>, and may use the selected one as a reference voltage.

The first rectification circuit 210 may have a circuit configuration the same as that illustrated in FIG. 3.

The second rectification circuit 220 may be activated depending on another one of the plurality of first control signals VGEN<1:4>, for example, the first control signal VGEN<2>.

The second rectification circuit 220 may select one of the plurality of pre-reference voltages VREF<0:2> depending on another one of the plurality of second control signals VSEL<1:4><0:1>, for example, the second control signal VSEL<2><0:1>, and may use the selected one as a reference voltage.

The third rectification circuit 230 may be activated depending on another one of the plurality of first control signals VGEN<1:4>, for example, the first control signal VGEN<3>.

The third rectification circuit 230 may select one of the plurality of pre-reference voltages VREF<0:2> depending on another one of the plurality of second control signals VSEL<1:4><0:1>, for example, the second control signal VSEL<3><0:1 and may use the selected voltage as a reference voltage.

The fourth rectification circuit 240 may be activated depending on another one of the plurality of first control signals VGEN<1:4>, for example, the first control signal VGEN<4>.

The fourth rectification circuit 240 may select one of the plurality of pre-reference voltages VREF<0:2> depending on another one of the plurality of second control signals VSEL<1:4><0:1> for example, the second control signal VSEL<4><0:1>, and may use the selected voltage as a reference voltage.

The first to fourth rectification circuits 210 to 240 may have the same circuit configuration.

The detection circuit 250 may generate a detection signal VGCMP according to a pre-detection signal VGOUT which is generated in each of the first to fourth rectification circuits 210 to 240.

The detection circuit 250 may generate the detection signal VGCMP by comparing the pre-detection signal VGOUT and a reference signal, that is, by comparing current of the pre-detection signal VGOUT and reference current.

The detection circuit 250 may have a circuit configuration the same as that illustrated in FIG. 4.

The reference voltage generation circuit 260 may generate the plurality of pre-reference voltages VREF<0:2> which have different voltages.

The reference voltage generation circuit 260 may have a circuit configuration which is the same as that illustrated in FIG. 5.

The state machine 270 may selectively activate the plurality of first control signals VGEN<1:4> and trim values of the plurality of second control signals VSEL<1:4><0:1> in output offset calibration operations of the first to fourth rectification circuits 210 to 240, and may store values of the plurality of second control signals VSEL<1:4><0:1> at times when the output offset calibration of the first to fourth rectification circuits 210 to 240 is completed, by monitoring the resultant detection signal VGCMP.

The switching circuit 280 may couple a first node NA and a pad 32-1 depending on the plurality of first control signals VGEN<1:4>.

The switching circuit 280 may have a circuit configuration which is the same as that illustrated in FIG. 6.

The output lines of the first to fourth rectification circuits 210 to 240 may be coupled in common to the first node NA.

The pad 32-1 may be any one of the plurality of pads of the input/output circuit region 32 illustrated in FIG. 7.

The external system 40 may perform a voltage forcing operation, that is, an operation of applying a voltage to the pad 32-1, and thereby making levels of the output terminals of the first to fourth rectification circuits 210 to 240 the same as a target level of the internal voltage VCCI.

An offset calibration operation of the voltage offset calibration system 2 in accordance with above-described another embodiment of the disclosure will be described.

The semiconductor apparatus 30 may sequentially perform offset calibration operations for the first to fourth rectification circuits 210 to 240, regardless of the order of the first to fourth rectification circuits 210 to 240.

In the embodiment of the disclosure, an example in which offset calibration operations are performed in the sequence of the first rectification circuit 210, the second rectification circuit 220, the third rectification circuit 230 and the fourth rectification circuit 240 will be described.

The semiconductor apparatus 30, that is, the state machine 270 of the semiconductor apparatus 30, may activate only the first control signal VGEN<1> among the plurality of first control signals VGEN<1:4> at a time that is internally set or/and according to a command of the external system 40. Hereinbelow, the activation of a signal may mean that the corresponding signal is a high level.

Since the first control signal VGEN<1> is a high level, the switching circuit 280 may couple the first node NA and the pad 32-1.

A level of the output terminal of the first rectification circuit 210 may become the same voltage level as the target level of the internal voltage VCCI by the voltage forcing of the external system 40 through the pad 32-1.

In an offset calibration process, levels of the output terminals of the first to fourth rectification circuits 210 to 240 are not generated inside the semiconductor apparatus 30 but are determined by the voltage forcing, that is, forced voltage application from the outside. Therefore, levels of the output terminals of the first to fourth rectification circuits 210 to 240 may be stably maintained to be the same as the target level of the internal voltage VCCI, regardless of the operation of the semiconductor apparatus 30.

Since the first control signal VGEN<1> is a high level, the third control signal AMPEN may be generated at a high level.

Since the first control signal VGEN<1> and the third control signal AMPEN are high levels, the pre-detection signal VGOUT generated in the first rectification circuit 210 among the first to fourth rectification circuits 210 to 240 may be provided to the detection circuit 250.

The detection circuit 250 may output the detection signal VGCMP at a high level or a low level depending on the pre-detection signal VGOUT.

The state machine 270 may trim a value of a pre-select signal VSELEXT<1><0:1> corresponding to the first rectification circuit 210 among pre-select signals VSELEXT<1:4><0:1>.

As the value of the pre-select signal VSELEXT<1><0:1> is trimmed, a value of the second control signal VSEL<1><0:1> corresponding to the first rectification circuit 210 among the plurality of second control signals VSEL<1:4><0:1> may be trimmed, and accordingly, a level of the reference voltage VREF of the first rectification circuit 210 may be trimmed.

The state machine 270 may monitor the transition of a logic level of the detection signal VGCMP while trimming a level of the reference voltage VREF of the first rectification circuit 210 in the manner described above.

When a logic level of the detection signal VGCMP transitions from a high level to a low level or from a low level to a high level, the state machine 270 may determine a corresponding time as a time at which the offset calibration of an output level of the first rectification circuit 210 is completed.

If a logic level transition of the detection signal VGCMP occurs, by stopping the trimming of the second control signal VSEL<1><0:1> and storing a corresponding signal value, the state machine 270 may complete the output offset calibration for the first rectification circuit 210.

Output offset calibration for the second to fourth rectification circuits 220 to 240 may be performed in the same method as the above-described output offset calibration method for the first rectification circuit 210.

If the output offset calibration for the first to fourth rectification circuits 210 to 240 is completed, the plurality of second control signals VSEL<1:4><0:1> for providing the reference voltage VREF capable of calibrating an output level offset of each of the first to fourth rectification circuits 210 to 240 may be stored in the state machine 270.

After the output offset calibration for the first to fourth rectification circuits 210 to 240 is completed, in a typical operation, all values of the plurality of first control signals VGEN<1:4> may become low levels, and accordingly, the first node NA and the pad 324 may be electrically decoupled and the output of the pre-detection signal VGOUT may be blocked.

In the typical operation, when the internal voltage enable signal VCCIEN becomes a high level, the first to fourth rectification circuits 210 to 240 may generate the internal voltage VCCI at the target level according to the plurality of second control signals VSEL<1:4><0:1> which are already stored.

While various embodiments have been described above, it will be understood to those skilled in the art that the embodiments described are examples only. Accordingly, the voltage generation circuit, the semiconductor apparatus including the same, and the voltage offset calibration system described herein should not be limited based on the described embodiments.

What is claimed is:
1. A voltage generation circuit comprising:
a plurality of rectification circuits configured to be selectively activated depending on a plurality of first control signals, and to generate an internal voltage according to respective reference voltages capable of being independently trimmed depending on a plurality of second control signals;

a detection circuit configured to generate a detection signal by comparing a pre-detection signal, generated in each of the plurality of rectification circuits, and a reference signal; and a storage circuit configured to store a pre-select signal provided from an external system, and output a stored signal as the plurality of second control signals.

2. The voltage generation circuit according to claim 1, further comprising:

a switching circuit configured to couple a first node, which is coupled in common to respective output lines of the plurality of rectification circuits, to a pad depending on the plurality of first control signals.

3. The voltage generation circuit according to claim 2, wherein the switching circuit comprises:

a switch coupled between the first node and the pad; and a logic gate configured to turn on the switch when any one among the plurality of first control signals is a first logic level.

4. The voltage generation circuit according to claim 2, wherein levels of output terminals of the plurality of rectification circuits are set to voltage levels which are the same as a target level of the internal voltage by voltage forcing through the pad.

5. The voltage generation circuit according to claim 1, wherein each of the plurality of rectification circuits comprises:

a differential amplifier configured to output a result of comparing the reference voltage and a feedback voltage;

a driver configured to generate the internal voltage by driving an external voltage depending on an output of the differential amplifier;

a divider resistor configured to output the feedback voltage by dividing the internal voltage;

a multiplexer configured to output the reference voltage by selecting one among a plurality of pre-reference voltages depending on a part of the plurality of second control signals; and a switch configured to output the output of the differential amplifier as the pre-detection signal depending on a part of the plurality of first control signals.

6. The voltage generation circuit according to claim 5, further comprising:

a logic gate configured to activate the differential amplifier depending on a result of ORing the part of the plurality of first control signals and an internal voltage enable signal for activating the plurality of rectification circuits in a typical operation.

7. The voltage generation circuit according to claim 1, wherein the detection circuit comprises:

a driver configured to drive current corresponding to the external voltage depending on the pre-detection signal; and a comparator configured to generate the detection signal by comparing the reference signal according to a reference current source and the current driven by the driver.

8. A semiconductor apparatus comprising:

a plurality of rectification circuits configured to be selectively activated depending on a plurality of first control signals, and to generate an internal voltage according to respective reference voltages capable of being independently trimmed depending on a plurality of second control signals;

a detection circuit configured to generate a detection signal by comparing a pre-detection signal, generated in each of the plurality of rectification circuits, and a reference signal; and a state machine configured to selectively activate the plurality of first control signals and trim values of the plurality of second control signals, and store values of the plurality of second control signals at times when output offset calibration of the plurality of rectification circuits is completed, by monitoring the resultant detection signal.

9. The semiconductor apparatus according to claim 8, further comprising:

a switching circuit configured to couple a first node, which is coupled in common to respective output lines of the plurality of rectification circuits, to a pad depending on the plurality of first control signals.

10. The semiconductor apparatus according to claim 9, wherein the switching circuit comprises:

a switch coupled between the first node and the pad; and a logic gate configured to turn on the switch when any one among the plurality of first control signals is a first logic level.

11. The semiconductor apparatus according to claim 9, wherein levels of output terminals of the plurality of rectification circuits are set to voltage levels the same as a target level of the internal voltage by voltage forcing of a voltage from a system external to the semiconductor apparatus through the pad.

12. The semiconductor apparatus according to claim 8, wherein each of the plurality of rectification circuits comprises:

a differential amplifier configured to output a result of comparing the reference voltage and a feedback voltage;

a driver configured to generate the internal voltage by driving an external voltage depending on an output of the differential amplifier;

a divider resistor configured to output the feedback voltage by dividing the internal voltage;

a multiplexer configured to output the reference voltage by selecting one among a plurality of pre-reference voltages depending on a part of the plurality of second control signals; and a switch configured to output the output of the differential amplifier as the pre-detection signal depending on a part of the plurality of first control signals.

13. The semiconductor apparatus according to claim 12, further comprising:

a logic gate configured to activate the differential amplifier depending on a result of ORing the part of the plurality of first control signals and an internal voltage enable signal for activating the plurality of rectification circuits in a typical operation.

14. The semiconductor apparatus according to claim 8, wherein the detection circuit comprises:

a driver configured to drive current corresponding to the external voltage depending on the pre-detection signal; and a comparator configured to generate the detection signal by comparing the reference signal according to a reference current source and the current driven by the driver.

15. The semiconductor apparatus according to claim 8, wherein the semiconductor apparatus further comprises:
a memory region;
an input/output circuit region configured to perform a data transmission/reception operation with respect to the memory region and an external system; and
a function circuit region including circuits for performing various functions related with an operation of the semiconductor apparatus,
wherein the plurality of rectification circuits are disposed in a distributed manner in the function circuit region.

16. A voltage offset calibration system comprising:
a semiconductor apparatus configured to output, to an outside, a detection signal which is generated by operating a plurality of rectification circuits, configured therein, depending on first and second control signals; and
an external system configured to generate the control signals, and calibrate an offset of an output voltage of each of the plurality of rectification circuits by monitoring the detection signal according to trimming a reference voltage of each of the plurality of rectification circuits by using the first and second control signals.

17. The voltage offset calibration system according to claim 16, wherein the external system is configured to make levels of output terminals of the plurality of rectification circuits the same as a target level of an internal voltage, by applying a voltage to the semiconductor apparatus.

18. The voltage offset calibration system according to claim 16, wherein the semiconductor apparatus comprises:
the plurality of rectification circuits configured to be selectively activated depending on a plurality of first control signals, and generate an internal voltage according to respective reference voltages capable of being independently trimmed depending on a plurality of second control signals,
a detection circuit configured to generate a detection signal by comparing a pre-detection signal, generated in each of the plurality of rectification circuits, and a reference signal; and
a storage circuit configured to store a pre-select signal provided from an external system, and output a stored signal as the plurality of second control signals.

19. The voltage offset calibration system according to claim 18, further comprising:
a switching circuit configured to couple a first node, which is coupled in common to respective output lines of the plurality of rectification circuits, to a pad depending on the plurality of first control signals.

20. The voltage offset calibration system according to claim 19, wherein the switching circuit comprises:
a switch coupled between the first node and the pad; and
a logic gate configured to turn on the switch when any one among the plurality of first control signals is a first logic level.

21. The voltage offset calibration system according to claim 18, wherein each of the plurality of rectification circuits comprises:
a differential amplifier configured to output a result of comparing the reference voltage and a feedback voltage;
a driver configured to generate the internal voltage by driving an external voltage depending on an output of the differential amplifier;
a divider resistor configured to output the feedback voltage by dividing the internal voltage;
a multiplexer configured to output the reference voltage by selecting one among a plurality of pre-reference voltages depending on a part of the plurality of second control signals; and
a switch configured to output the output of the differential amplifier as the pre-detection signal depending on a part of the plurality of first control signals.

22. The voltage offset calibration system according to claim 21, further comprising:
a logic gate configured to activate the differential amplifier depending on a result of ORing the part of the plurality of first control signals and an internal voltage enable signal for activating the plurality of rectification circuits in a typical operation.

23. The voltage offset calibration system according to claim 18, wherein the detection circuit comprises:
a driver configured to drive current corresponding to the external voltage depending on the pre-detection signal; and
a comparator configured to generate the detection signal by comparing the reference signal according to a reference current source and the current driven by the driver.

24. The voltage offset calibration system according to claim 18, wherein the semiconductor apparatus further comprises:
a memory region;
an input/output circuit region configured to perform a data transmission/reception operation with respect to the memory region and an external system; and
a function circuit region including circuits for performing various functions related with an operation of the semiconductor apparatus,
wherein the plurality of rectification circuits are disposed in a distributed manner in the function circuit region.

* * * * *